(12) United States Patent
Ma et al.

(10) Patent No.: US 7,805,662 B2
(45) Date of Patent: Sep. 28, 2010

(54) ERROR CORRECTION CODE DECODER

(75) Inventors: Ching-Wen Ma, Nantou (TW); Kuo-Ming Wang, Taipei (TW); Jia-Ping Chen, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 902 days.

(21) Appl. No.: 11/704,292

(22) Filed: Feb. 9, 2007

(65) Prior Publication Data

US 2007/0204207 A1  Aug. 30, 2007

(30) Foreign Application Priority Data

Feb. 10, 2006  (TW) .............................. 95104595 A

(51) Int. Cl.
*H03M 13/00* (2006.01)

(52) U.S. Cl. .................. 714/784; 714/756; 714/785

(58) Field of Classification Search ................. 714/781, 714/784, 785, 756
See application file for complete search history.

(56) References Cited

U.S. PATENT DOCUMENTS

| | | | | |
|---|---|---|---|---|
| 5,297,153 A * | 3/1994 | Baggen et al. | ............... | 714/782 |
| 5,323,402 A * | 6/1994 | Vaccaro et al. | ............... | 714/782 |
| 5,373,511 A * | 12/1994 | Veksler | ........................ | 714/755 |
| 6,119,262 A * | 9/2000 | Chang et al. | ................. | 714/781 |
| 6,209,115 B1 * | 3/2001 | Truong et al. | ............... | 714/784 |
| 6,347,389 B1 * | 2/2002 | Boyer | ......................... | 714/784 |
| 6,449,746 B1 * | 9/2002 | Truong et al. | ............... | 714/784 |
| 6,792,569 B2 * | 9/2004 | Cox et al. | .................... | 714/781 |
| 6,954,892 B2 * | 10/2005 | Lee et al. | ..................... | 714/784 |
| 7,047,481 B2 * | 5/2006 | Marconetti | ................... | 714/784 |
| 7,096,409 B2 * | 8/2006 | Banks | .......................... | 714/784 |
| 7,278,086 B2 * | 10/2007 | Banks et al. | ................. | 714/784 |

* cited by examiner

*Primary Examiner*—Esaw T Abraham
(74) *Attorney, Agent, or Firm*—Bacon & Thomas, PLLC

(57) ABSTRACT

An ECC decoder for correcting a coded signal received, which includes a syndrome calculation and errata evaluation device to receive a code word of the coded signal for performing a syndrome calculation to thereby output a syndrome polynomial, and to receive an erasure and errata evaluator polynomial and an errata position for performing an errata evaluation to thereby output an errata and erasure value and correct the coded signal; a key equation solving device to receive the syndrome for generating an erasure and errata locator polynomial and the erasure and errata evaluator polynomial; and an errata position search device to receive the erasure and errata locator polynomial for searching and outputting the errata position. Evaluating the errata and erasure value and calculating the syndrome are performed in pipeline, thereby sharing the hardware and relatively reducing the hardware cost.

11 Claims, 10 Drawing Sheets

ERROR CORRECTION CODE DECODER

BACKGROUND OF THE INVENTION

1. Field of the Invention

The invention relates to an error correction code (ECC) decoder and, more particularly, to an ECC decoder capable of saving hardware cost.

2. Description of Related Art

FIG. 1 is a block diagram of a conventional decoder 100 capable of processing erasure and errata correction in parallel. As shown, the decoder 100 includes a syndrome calculation device 110, a syndrome modification device 120, a key equation solving device 130, a Chien search device 140 and an errata evaluation device 150.

The syndrome calculation device 110 receives a code word R(x) of a coded signal for a syndrome calculation to thereby output a syndrome polynomial S(x). FIG. 2 is a block diagram of the syndrome calculation device 110, which is essentially composed of module-2 adders 210, registers 220 and finite-field constant multipliers 230, where $r_0, r_1, \ldots, r_{n-2}, r_{n-1}$ indicate the code word R(x), and $\alpha^i$ indicates an errata position. The syndrome modification device 120 modifies the syndrome polynomial S(x), and accordingly the key equation solving device 130 can effectively generate an erasure and errata locator polynomial $\sigma(X)$ and an erasure and errata evaluator polynomial $\omega(x)$. FIG. 3 is a block diagram of the key equation solving device 130, which is essentially composed of module-2 adders 310, registers 320 and finite-field constant multipliers 330.

As shown in FIG. 1, the decoder 100 is typically divided into three pipelines in order to increase the decoding speed. Generally, the syndrome calculation performed by the syndrome calculator is not merged into a pipeline with other operations. The syndrome calculation requires successively reading data from memory and writing updated data back to the memory after the data is decoded, which increases the complexity of memory access control. In addition, the syndrome calculation and other pipelines may be performed concurrently, and accordingly a specific circuit is required in the syndrome calculation, which increases the die size and the hardware cost.

Therefore, it is desirable to provide an improved error correction code decoder to mitigate and/or obviate the aforementioned problems.

SUMMARY OF THE INVENTION

The object of the invention is to provide an error correction code (ECC) decoder, which can save required memory access number to thereby increase the decoding speed, and reduce required gate counts by hardware sharing on the decoder design to thus relatively reduce the hardware cost.

In accordance with one aspect of the present invention, there is provided an error correction code (ECC) decoder, which uses a data channel to receive a coded signal obtained by a channel coding. The coded signal received contains redundancy information for correction. The decoder includes a syndrome calculation and errata evaluation device, a key equation solving device and an errata position search device. The syndrome calculation and errata evaluation device receives a code word of a coded signal for performing a syndrome calculation to thereby output a syndrome polynomial, and receives an erasure and errata evaluator polynomial and an errata position for performing an errata evaluation to thereby output an errata and erasure value in order to correct the code word of the coded signal. The key equation solving device receives the syndrome polynomial, and generates an erasure and errata locator polynomial and the erasure and errata evaluator polynomial. The errata position search device receives the erasure and errata locator polynomial, and uses a trial-and-error process to search and output the errata position.

Other objects, advantages, and novel features of the invention will become more apparent from the following detailed description when taken in conjunction with the accompanying drawings.

DETAILED DESCRIPTION OF THE PREFERRED EMBODIMENT

The invention provides an error correction code decoder, which uses a data channel to receive a coded signal obtained by a channel coding. The coded signal received contains redundancy information for error correction and detection. The data channel can be a wireless channel such as an RF channel defined in the IEEE802.11a, IEEE802.11b or IEEE802.16. The data channel can also be a wired channel. For example, the ECC decoder can be applied to a compact disk (CD), a digital audio tape (DAT), a mini-disc (MD) or a digital versatile disc (DVD).

Figure 4:
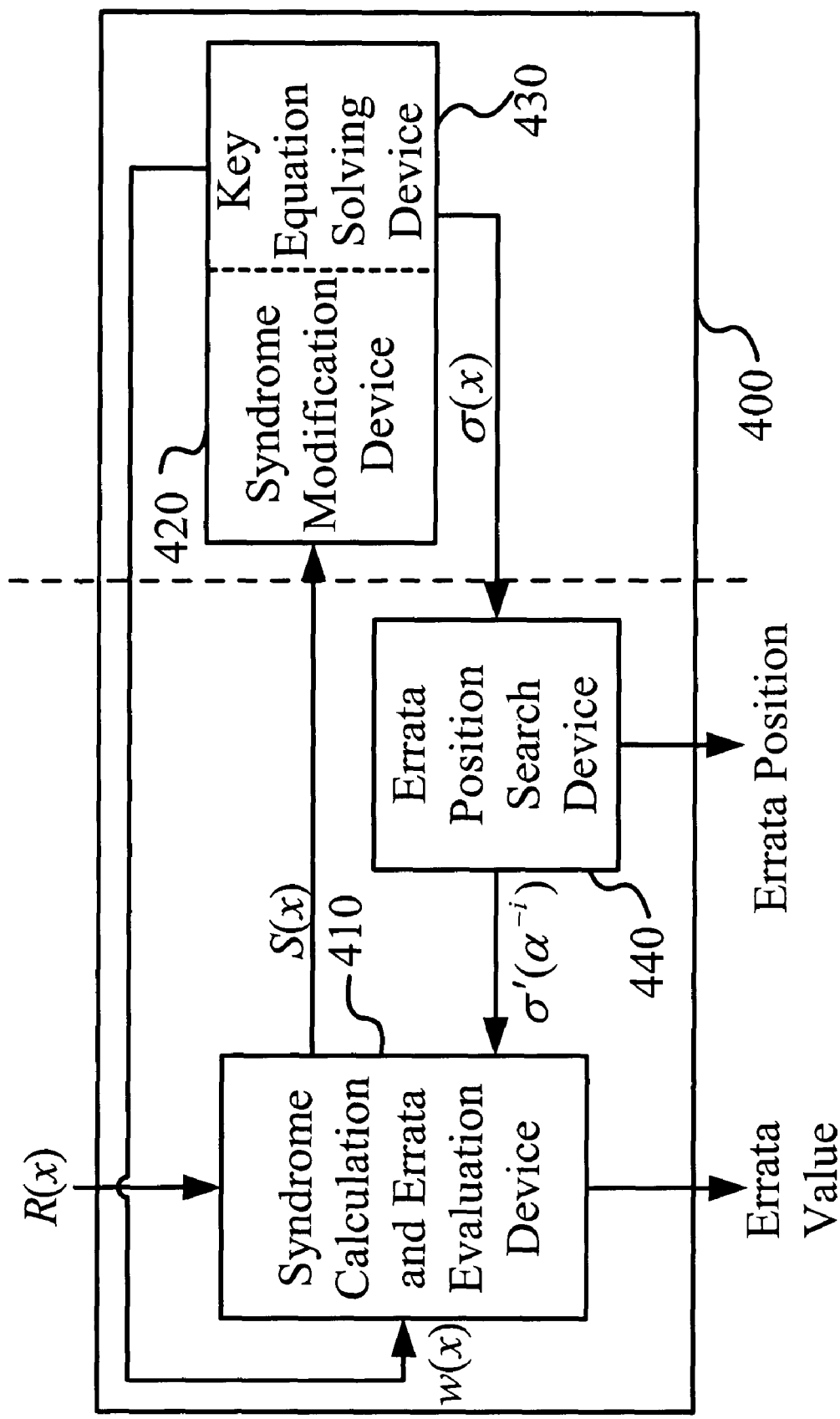
FIG. 4 is a block diagram of an ECC decoder in accordance with the invention.

FIG. 4 is a block diagram of an ECC decoder 400 in accordance with the invention. As shown, the ECC decoder 400 includes a syndrome calculation and errata evaluation device 410, a syndrome modification device 420, a key equation solving device 430 and an errata position search device 440.

The syndrome calculation and errata evaluation device 410 receives a code word R(x) of the coded signal for a syndrome calculation to thereby output a syndrome polynomial S(x), and receives an erasure and errata evaluator polynomial $\omega(X)$ generated by the key equation solving device 430 and an errata position σ'(α⁻ⁱ) output by the errata position search device 440 to thereby perform an errata evaluation and output an errata and erasure value for correcting the code word of the coded signal.

The syndrome modification device 420 is connected to the syndrome calculation and errata evaluation device 410 to thereby correct the syndrome polynomial S(x). Thus, the key equation solving device 430 can effectively generate an erasure and errata locator polynomial σ(X) and the erasure and errata evaluator polynomial ω(X). The errata position search device 440 receives the erasure and errata locator polynomial σ(X), uses a trial-and-error process to search, and outputs the errata position σ'(α⁻ⁱ). The trial-and-error process is preferably a Chein search process.

The ECC decoder 400 is a decoding configuration with two pipelines. In the first pipeline, the errata position search device 440 searches an errata and erasure position. The syndrome calculation and errata evaluation device 410 calculates an errata and erasure value and evaluates a syndrome. In the second pipeline, the syndrome modification device 420 and the key equation solving device 430 modifies the syndrome and a key decryption equation. Because calculating the errata and erasure value and evaluating the syndrome are not performed concurrently in the first pipeline, registers, multipliers and adders required for the calculation and evaluation can be shared to relatively reduce the hardware cost.

It is assumed that $GF(2^m)$ represents a finite field having $2^m$ elements, α indicates a primitive element in $GF(2^m)$ and C indicates an (n, k) cyclic code in $GF(2^m)$. The cyclic code is preferred a Reed-Solomon (RS) or BCH code with a minimum distance d=n-k+1. If R(x) indicates a code word of a coded signal received, the i-th syndrome $S_i$ is defined as:

$$S_i = \sum_{j=0}^{n-1} R_j(\alpha^i)^j.$$

Based on the Forney rule, the i-th syndrome $S_i$ can be rewritten as follows:

$$S_i = \sum_{j=0}^{n-1} R_j(\alpha^j)^i = (((r_{n-1}\alpha^i + r_{n-2})\alpha^i + r_{n-3})\alpha^i + \ldots) + r_0. \quad (1)$$

Figure 2:
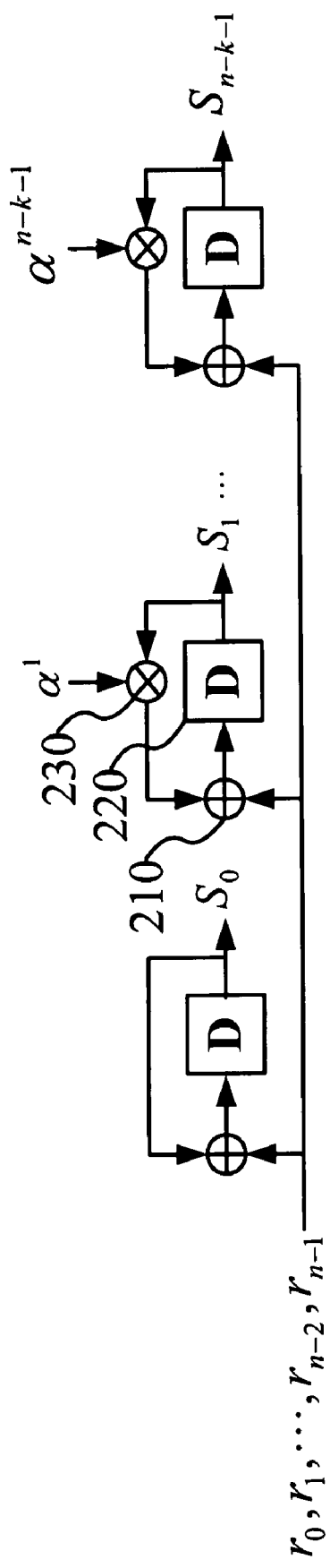
FIG. 2 is a block diagram of a conventional syndrome calculation device.

Upon equation (1), the syndrome calculation can be performed by a simple architecture. For example, the typical syndrome calculation device 110 shown in FIG. 2 is essentially composed of the module-2 adders 210, the registers 220 and the finite-field constant multipliers 230, where $r_0, r_1, \ldots, r_{n-2}, r_{n-1}$ are a code word R(x) and $\alpha^i$ indicates an errata position. Such an architecture, as shown in FIG. 2, totally requires (n−k) m-bit registers 220, (n−k−1) finite-field constant multipliers 230, and (n−k) finite-field adders 210.

When the erasure and errata locator polynomial σ(x) and the erasure and errata evaluator polynomial ω(x) are obtained by the key equation solving device 130, an errata and erasure value can be obtained by the following Forney equation:

$$\overline{Y}_i = \frac{\omega(\overline{X}_i^{-1})}{\overline{X}_i^{-1}\sigma'(\overline{X}_i^{-1})} = \frac{\omega(\overline{X}_i^{-1})}{\overline{X}_i^{-1}\sigma_{odd}(\overline{X}_i^{-1})}.$$

Figure 3:
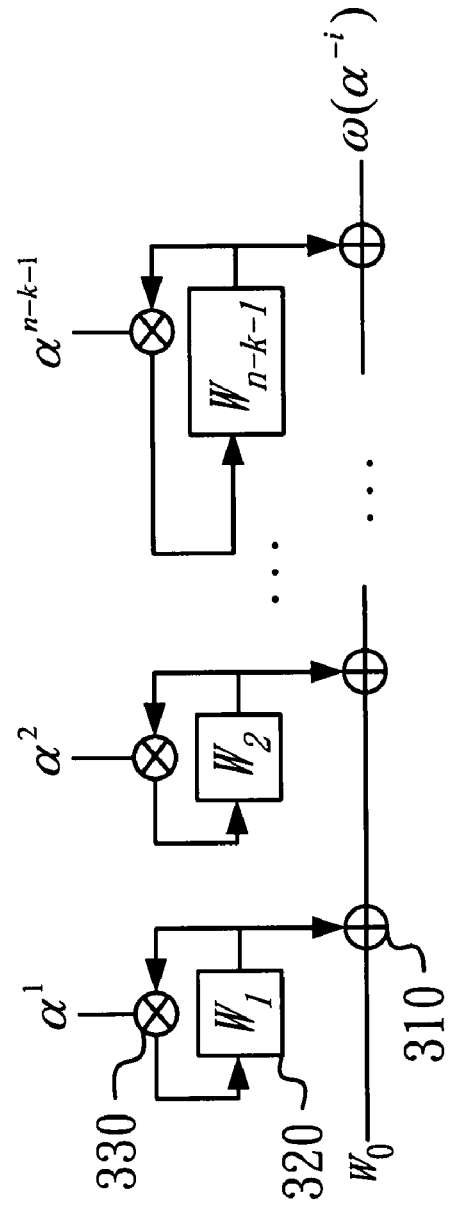
FIG. 3 is a block diagram of a conventional key equation solving device.

From the cited Forney equation, in order to obtain the errata and erasure value, it is required to first evaluate a value of $\omega(\overline{X}_i^{-1})$ as shown in FIG. 3. For the conventional errata evaluation device 150 to evaluate $\omega(\overline{X}_i^{-1})$, it is essentially composed of the module-2 adders 310, the registers 320 and the finite-field constant multipliers 330. Such a configuration totally requires (n−k−1) m-bit registers 320, (n−k−1) finite-field constant multipliers 330, and (n−k−1) finite-field adders 310. Thus, because the erasure and errata evaluation and the syndrome calculation are performed concurrently, a typical configuration, as shown in FIGS. 2 and 3, totally requires (2n−2k−1) m-bit registers, (2n−2k−2) finite-field constant multipliers, and (2n−2k−1) finite-field adders.

Figure 5:
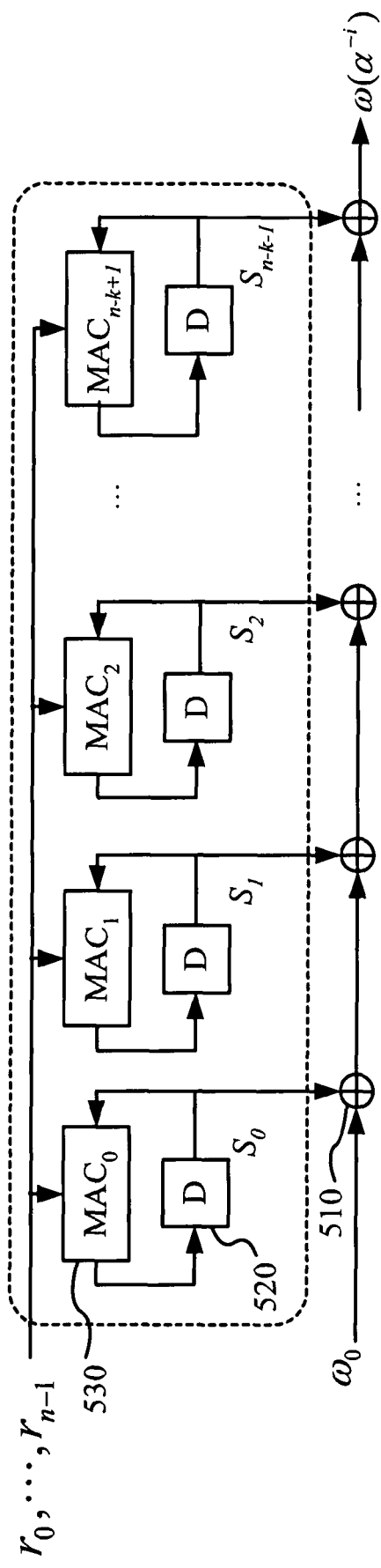
FIG. 5 is a block diagram of a syndrome calculation and errata evaluation device in accordance with the invention.

However, in the present invention, the erasure and errata evaluation and the syndrome calculation are not performed at the same time. Accordingly the registers, multipliers and adders shown in FIGS. 2 and 3 can be shared. In the present invention, the syndrome calculation and errata evaluation device 410 merges the typical devices into a common architecture to compute an errata and erasure value and a syndrome. FIG. 5 is a block diagram of the syndrome calculation and errata evaluation device 410 in accordance with the invention. As shown, to compute an errata and erasure value and a syndrome, the syndrome calculation and errata evaluation device 410 of the present invention totally contains (n−k) m-bit registers, (n−k) finite-field constant multipliers, and (n−k) finite-field adders. As compared to the prior architecture, only a half of the elements is required by such the architecture of the present invention.

Figure 6:
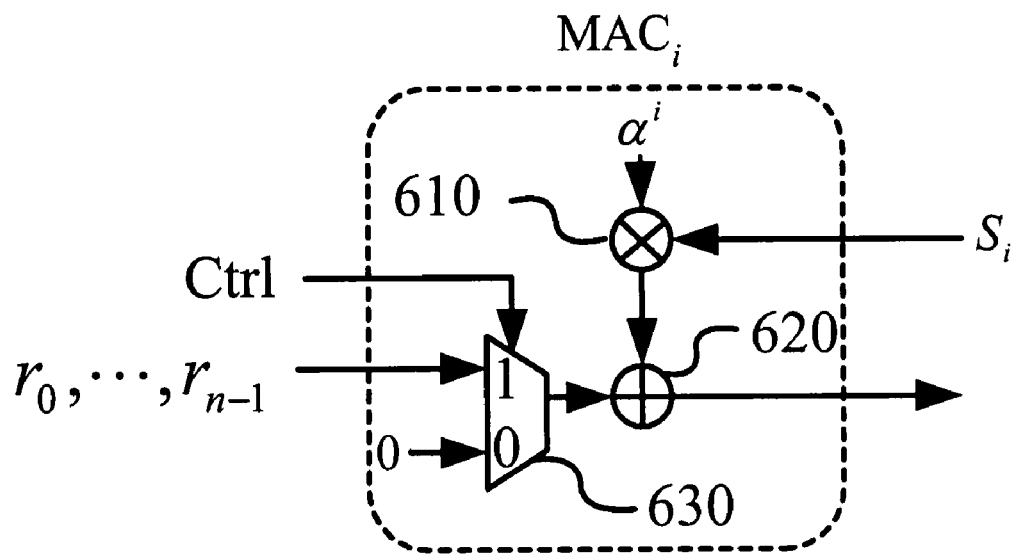
FIG. 6 is a block diagram of a multiplier-accumulator in accordance with the invention.

As shown in FIG. 5, the syndrome calculation and errata evaluation device 410 is composed of module-2 adders 510, registers 520 and multiplier-accumulators (MACs) 530. FIG. 6 is a block diagram of a multiplier-accumulator 530 in accordance with the invention. As shown, the multiplier-accumulator 530 is composed of a finite-field constant multiplier 610, a module-2 adder 620 and a multiplexer 630.

For calculating a syndrome, a control signal Ctrl is set to a high potential (1), and the multiplexer 630 selects $r_i$, which is the i-th coefficient of a code word $R(x)=[r_0, r_1, \ldots, r_{n-2}, r_{n-1}]$ of the coded signal. For evaluating an errata and erasure value, the control signal Ctrl is set to a low potential (0). Accordingly, the hardware sharing can be achieved.

For efficiently accessing to an external memory, the ECC decoder 400 is operated with two pipelines. The syndrome calculation and errata evaluation device 410 and the errata position search device 440 are activated in the first pipeline to calculate a syndrome or evaluate an errata and erasure value and search an errata and erasure position. The syndrome modification device 420 and the key equation solving device 430 are activated in the second pipeline to modify the syndrome and solve a key equation for obtaining an erasure and errata locator polynomial σ(x) and an erasure and errata evaluator polynomial ω(x).

Figure 7:
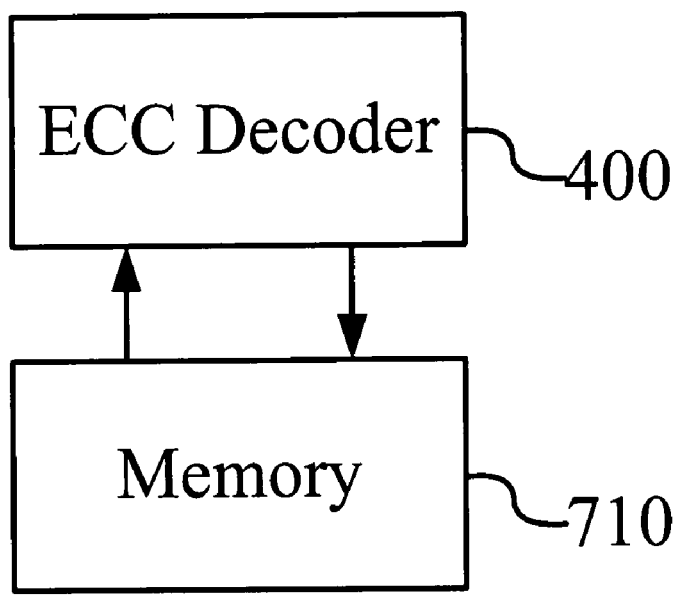
FIG. 7 is a schematic view of applying an ECC decoder in a CD player in accordance with the invention.

FIG. 7 is a schematic view of applying an ECC decoder to a compact disk (CD) player in accordance with the invention. As shown, the ECC decoder 400 uses a memory 710 to store data when performing the data interleaving of cross-interleaving Reed-Solomon code (CIRC). Accordingly, the ECC decoder 400 can operate in the first pipeline to search an errata and erasure position and evaluate an errata and erasure value, and concurrently performs a write-in operation on the memory 710, or performs a readout operation on the memory 710 when calculating a syndrome.

Figure 8:
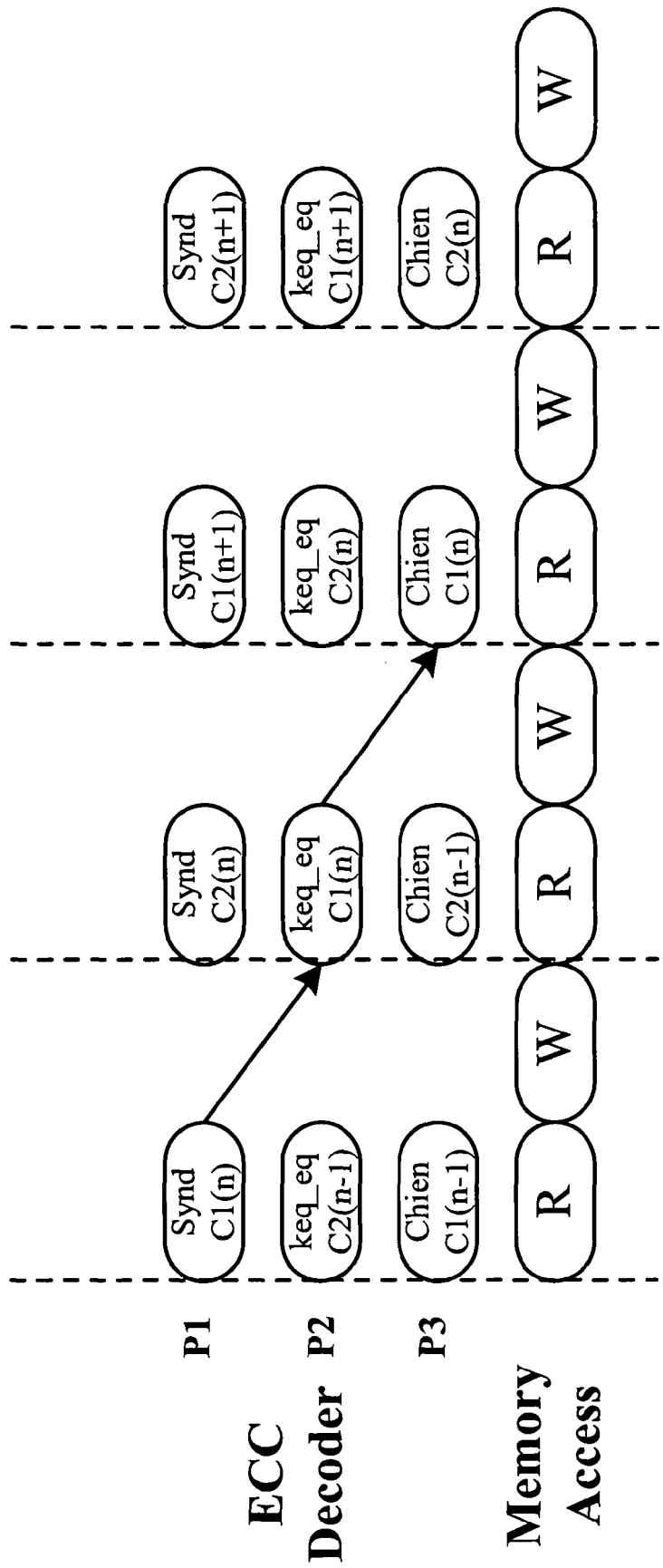
FIG. 8 is a schematic view of applying a typical CD player for decoding.

FIG. 8 is a schematic view of applying a conventional CD player in decoding. As shown, the ECC decoder 100 performs a syndrome calculation on C1(n) in the first pipeline P1, a key equation solving on C2(n–1) in the second pipeline P2, and a Chein search on C1(n–1) in the third pipeline P3.

Figure 9:
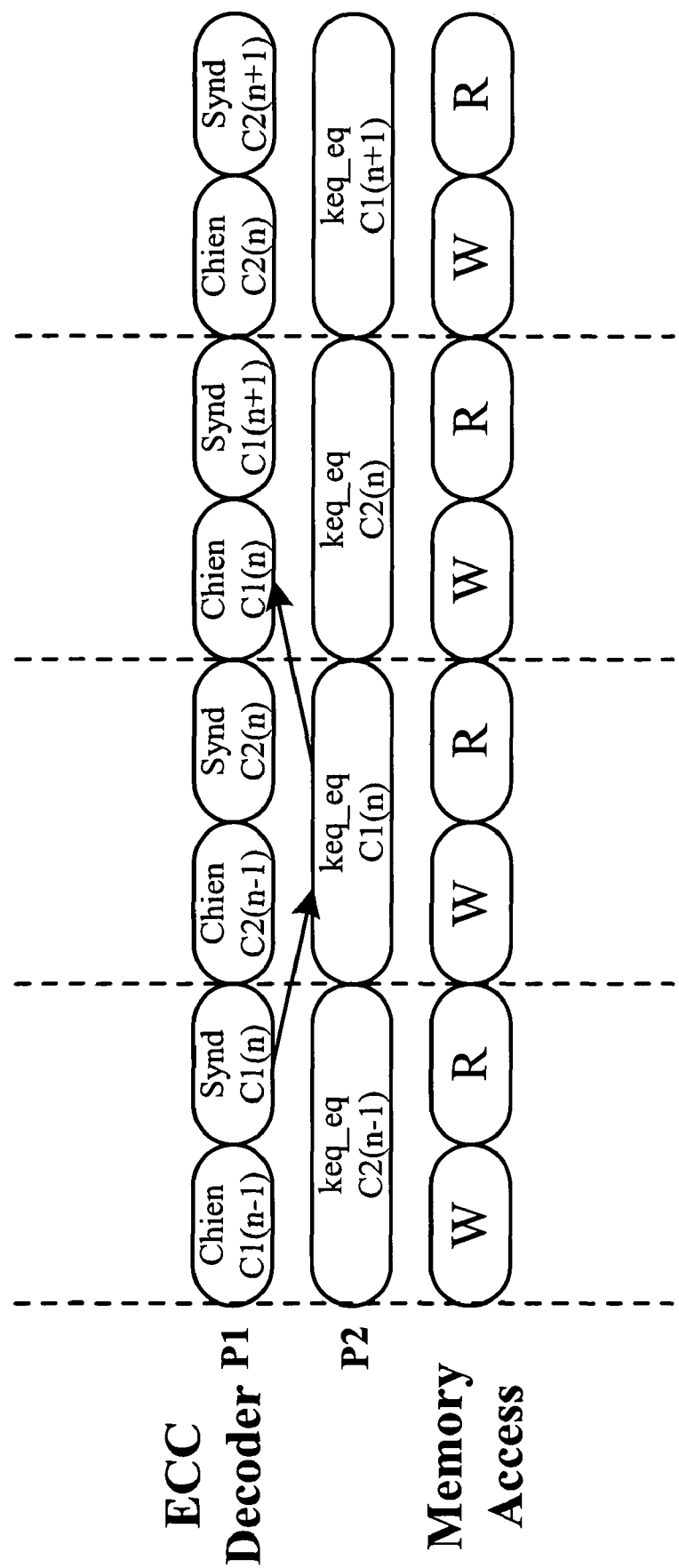
FIG. 9 is a schematic view of applying a CD player containing an ECC decoder for decoding in accordance with the invention.

FIG. 9 is a schematic view of applying a CD player containing the ECC decoder 400 for decoding in accordance with the invention. As shown, in the front stage of the first pipeline P1, the errata position search device 440 performs a Chein search on C1(n–1) and searches an errata and erasure position σ'(α$^{-i}$). At the same time, the syndrome calculation and errata evaluation device 410 evaluates an errata and erasure value of C1(n–1) and writes a corresponding result in the memory 710. Since the hardware of the ECC decoder 400 is shared, in the back stage of the first pipeline P1, the syndrome calculation and errata evaluation device 410 performs a syndrome calculation on C1(n), and concurrently a readout operation on the memory 710. In the second pipeline P2, the syndrome modification device 420 and the key equation solving device 430 perform a key equation solving on C2(n–1). Namely, the ECC decoder 400 performs a write-in operation on the memory 710 when searching the errata and erasure position and evaluating the errata and erasure value in the first pipeline P1, and performs a readout operation on the memory 710 when calculating the syndrome.

Figure 1:
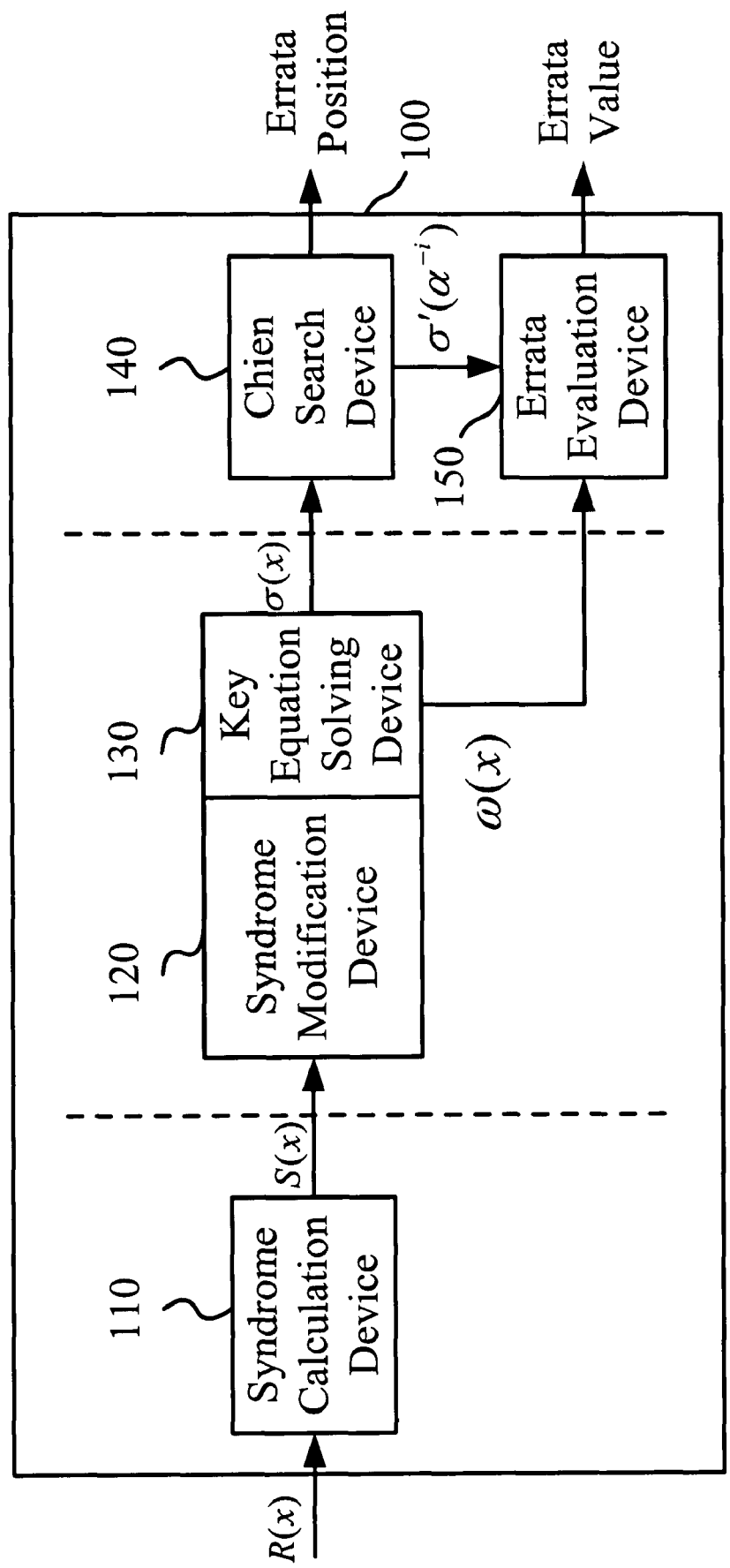
FIG. 1 is a block diagram of a conventional decoder capable of processing erasure and errata correction in parallel.
Figure 10:
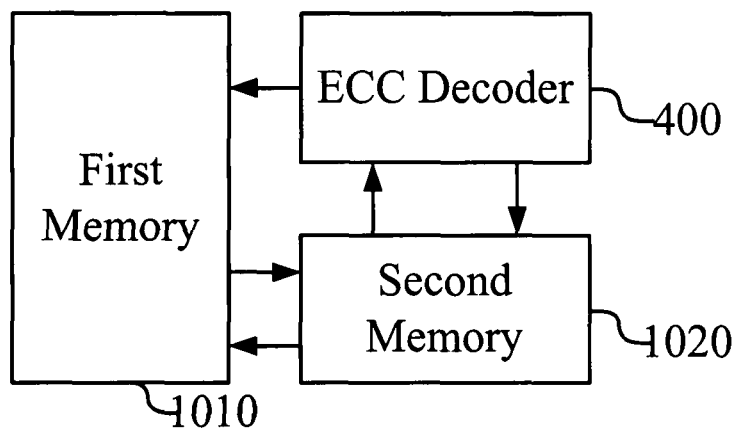
FIG. 10 is a schematic view of applying an ECC decoder in a DVD player in accordance with the invention.
Figure 11:
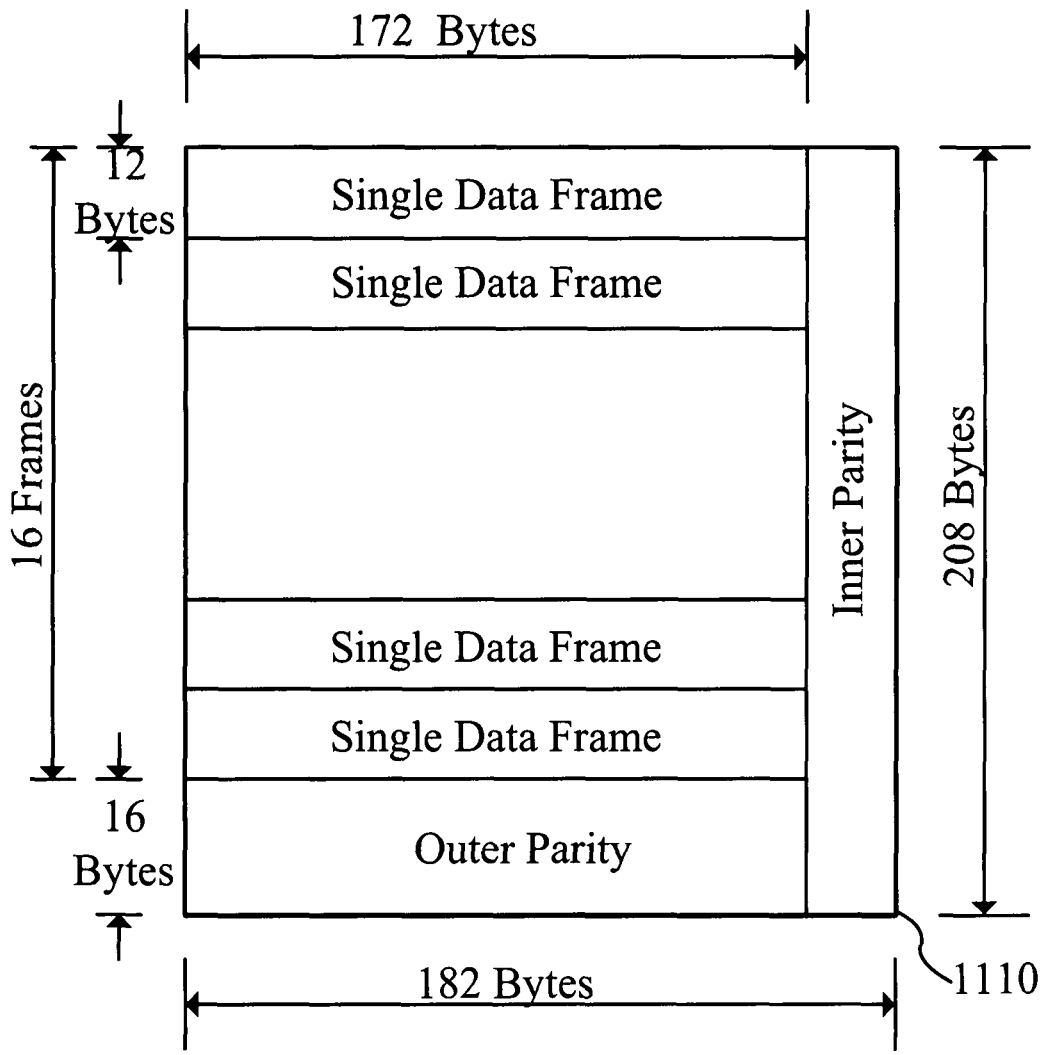
FIG. 11 is a diagram of an ECC data block in a DVD player in accordance with the invention.

FIG. 10 is a schematic view of applying the ECC decoder 400 in a DVD player in accordance with the invention, in which a Reed-Solomon product code (RSPC) is used as an error correction code in the DVD player. FIG. 1 is a schematic view of an ECC data block 1110 in the DVD player of FIG. 10 in accordance with the invention. As shown in FIG. 11, there are 208 rows and 182 columns, each row indicating a (182, 172) Reed-Solomon code and each column indicating a (208, 192) Reed-Solomon code. The ECC data block 1110 has a large amount of data, and accordingly two memories are used in the DVD player. As shown in FIG. 10, the first memory 1010 typically is a DRAM to store a large data of the ECC data block 1110, and the second memory 1020 typically is an SRAM to temporarily store a column or row to be decoded. Accordingly, such an arrangement can achieve a best ratio of performance to price.

Figure 12:
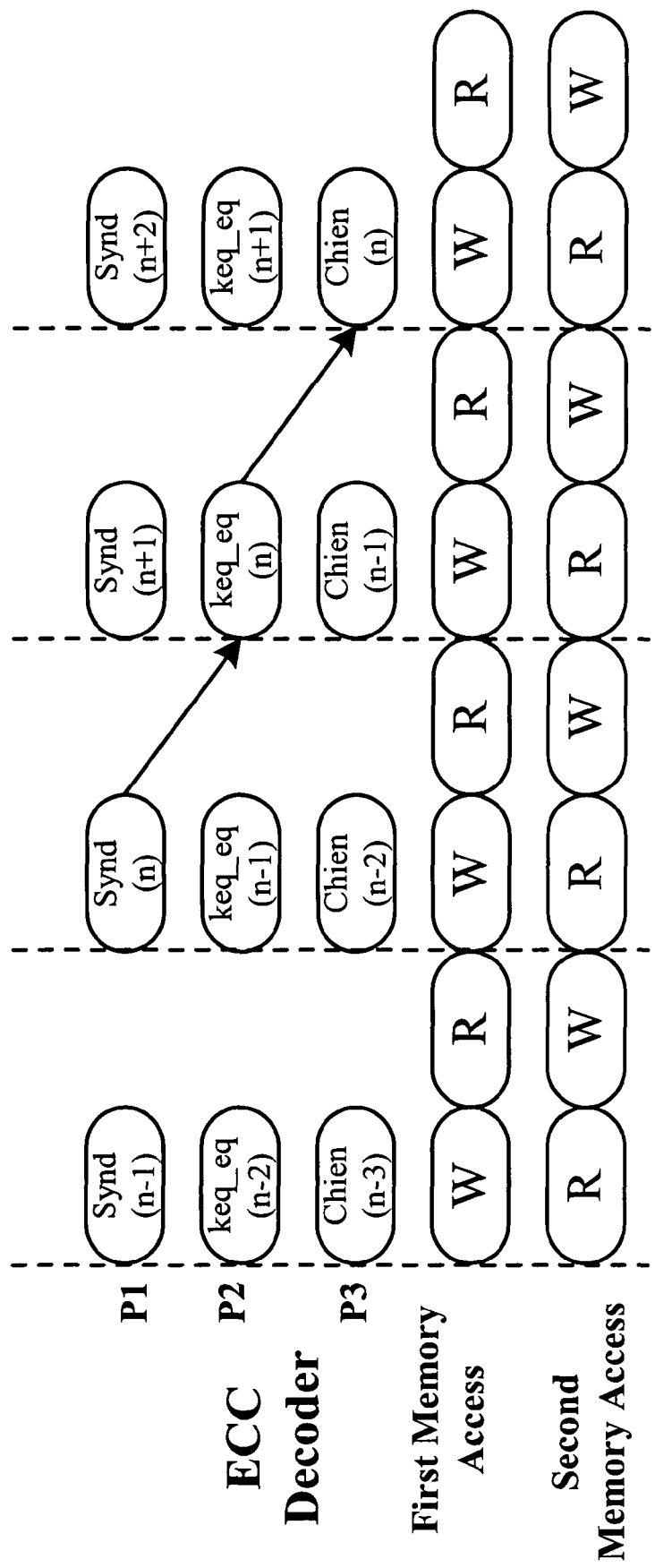
FIG. 12 is a schematic diagram of applying a typical DVD player for decoding.

FIG. 12 is a schematic view of applying a conventional DVD player for decoding. As shown, the ECC decoder 100 performs a syndrome calculation on (n) in the first pipeline P1, a key equation solving on (n–1) in the second pipeline P2, and a Chien search on (n–2) in the third pipeline P3.

Figure 13:
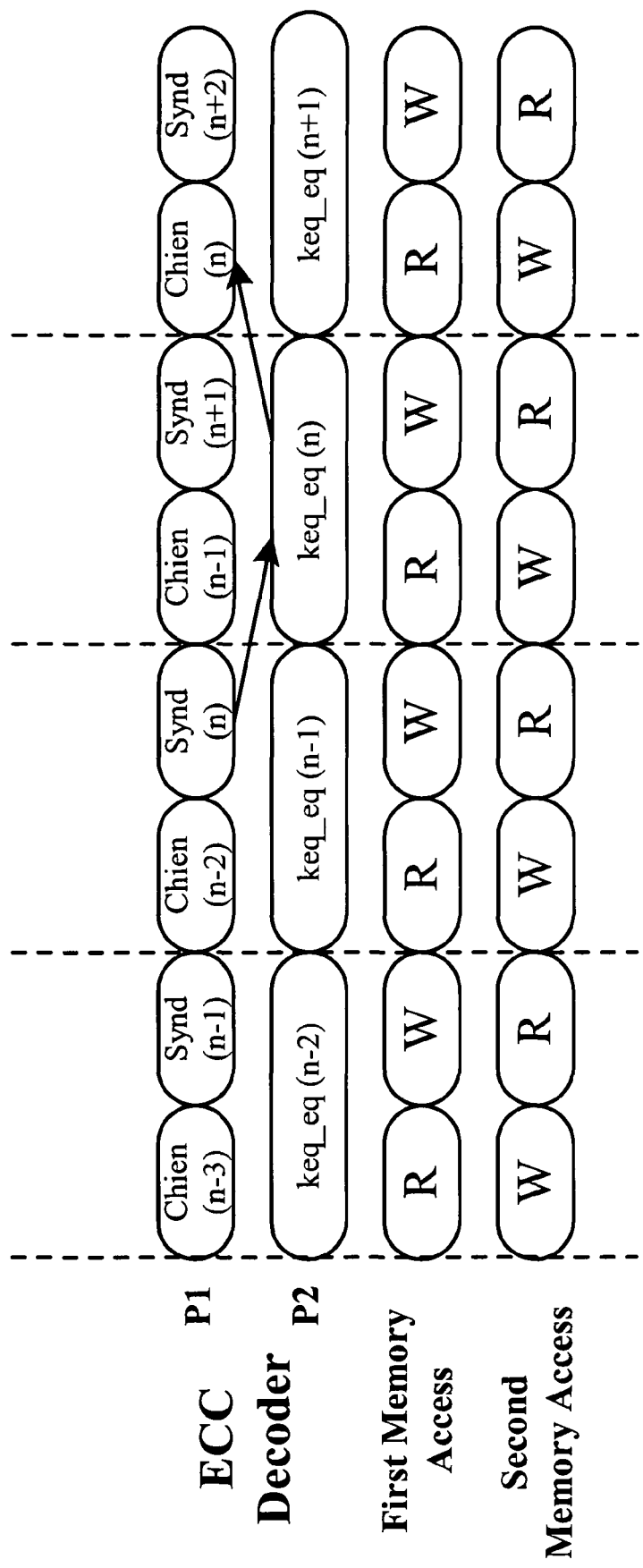
FIG. 13 is a schematic diagram of applying a DVD player containing an ECC decoder for decoding in accordance with the invention.

FIG. 13 is a schematic view of applying a DVD player containing the ECC decoder 400 for decoding in accordance with the invention. As shown, in the front stage of the first pipeline P1, the errata position search device 440 reads data, which is associated with the erasure and errata locator polynomial σ(x), from the first memory 1010 for performing a Chein search on (n–2) to thereby search the errata and erasure position σ'(α$^{-i}$). The syndrome calculation and errata evaluation device 410 reads data, which is associated with the erasure and errata evaluator polynomial ω(X), from the first memory 1010 for evaluating an errata and erasure value of (n–2) and writing a corresponding result in the second memory 1020.

Since the hardware of the ECC decoder 400 is shared, in the back stage of the first pipeline P1, the syndrome calculation and errata evaluation device 410 calculates a syndrome of (n), performs a readout operation on the second memory 1020, and writes a syndrome polynomial S(x) of (n) in the first memory 1010 concurrently. In the second pipeline P2, the syndrome modification device 420 reads the syndrome polynomial S(x) from the first memory 1010 for modification. The key equation solving device 430 is based on the syndrome polynomial S(x) modified to perform a key equation solving on (n–1). Namely, when searching the errata and erasure position and evaluating the errata and erasure value in the first pipeline P1, the ECC decoder 400 performs a readout operation on the first memory 1010 and subsequently a write-in operation on the second memory 1020. Moreover, when calculating the syndrome in the first pipeline P1, the ECC decoder 400 performs a readout operation on the second memory 1020 and subsequently a write-in operation on the first memory 1010.

In view of the foregoing, it is known that the syndrome calculation and errata evaluation device 410 of the present invention merges the typical syndrome calculation device 110 and the errata evaluation device 150 into a common architecture to compute an errata and erasure value and a syndrome. In this architecture, evaluating the errata and erasure value and calculating the syndrome are not concurrently performed, and accordingly the registers, the multipliers and the adders required for the performing those operations can be shared. Thus, the hardware sharing is achieved, and the hardware cost is relatively reduced. As shown in FIG. 5, only (n–k) m-bit registers, (n–k) finite-field constant multipliers and (n–k) finite-field adders are used to implement the device 410, which requires only half the cost for the conventional architecture.

Although the present invention has been explained in relation to its preferred embodiment, it is to be understood that many other possible modifications and variations can be made without departing from the spirit and scope of the invention as hereinafter claimed.

What is claimed is:

1. An error correction code decoder, which uses a data channel to receive a coded signal obtained by channel coding, the coded signal containing redundancy information for correction, the decoder comprising:

a syndrome calculation and errata evaluation device, which receives a code word of the coded signal to thereby output a syndrome polynomial according to a syndrome calculation, and receives an erasure and errata evaluator polynomial and an errata position to output an errata and erasure value according to an errata evaluation in order to correct the code word of the coded signal;

a key equation solving device, which receives the syndrome polynomial, and generates an erasure and errata locator polynomial and the erasure and errata evaluator polynomial; and an errata position search device, which receives the erasure and errata locator polynomial, and uses a trial-and-error process to output the errata position.

2. The decoder as claimed in claim 1, further comprising a syndrome modification device, which modifies the syndrome polynomial for the key equation solving device to generate the erasure and errata locator polynomial and the erasure and errata evaluator polynomial.

3. The decoder as claimed in claim 2, wherein the error correction code decoder is implemented to be a decoding configuration having a first pipeline and a second pipeline.

4. The decoder as claimed in claim 3, wherein the syndrome calculation and errata evaluation device and the errata position search device are operated in the first pipeline to calculate a syndrome, search an errata and erasure position, and evaluate an errata and erasure value.

5. The decoder as claimed in claim 4, wherein the key equation solving device is operated in the second pipeline to modify the syndrome and solve a key equation.

6. The decoder as claimed in claim 1, wherein the trial-and-error process is a Chein search.

7. The decoder as claimed in claim 1, wherein the data channel is a wireless channel.

8. The decoder as claimed in claim 1, wherein the data channel is a wired channel.

9. The decoder as claimed in claim 1, wherein the coded signal is a cyclic code.

10. The decoder as claimed in claim 9, wherein the cyclic code is a BCH code.

11. The decoder as claimed in claim 9, wherein the cyclic code is a Reed-Solomon code.

* * * * *